United States Patent [19]

Kosakowski

[11] 4,163,221

[45] Jul. 31, 1979

[54] CAPACITANCE TO DIGITAL CONVERSION SYSTEM

[75] Inventor: Henry R. Kosakowski, Denville, N.J.

[73] Assignee: The Bendix Corporation, Teterboro, N.J.

[21] Appl. No.: 896,951

[22] Filed: Apr. 17, 1978

[51] Int. Cl.² ............................................. H03K 13/02
[52] U.S. Cl. ........................... 340/347 AD; 340/347 R
[58] Field of Search .................... 340/347 AD, 347 R; 361/424

[56] References Cited

U.S. PATENT DOCUMENTS

| | | | |
|---|---|---|---|
| 3,506,877 | 4/1970 | Owen | 361/424 |
| 3,816,911 | 6/1974 | Knappenberger | 361/424 |
| 4,001,813 | 1/1977 | Kosakowski | 340/347 R |

OTHER PUBLICATIONS

Graeme, Jerald J. — Designing with Operational Amplifiers Applications Alternatives, 1977 by McGraw Hill, pp. 261-262.

Primary Examiner—Malcolm A. Morrison
Assistant Examiner—Gary Chin
Attorney, Agent, or Firm—Anthony F. Cuoco; William F. Thornton

[57] ABSTRACT

A capacitance to digital conversion system wherein condition sensing capacitors and reference capacitors are arranged with circuitry including a virtual ground and means for providing an error signal related to the sensed condition. The capacitors, virtual ground and error signal means are disposed within a sealed housing so that the system is isolated from environmental influences and is hence more stable than like systems known in the art.

4 Claims, 2 Drawing Figures

CAPACITANCE TO DIGITAL CONVERSION SYSTEM

FIELD OF THE INVENTION

This invention relates generally to analog to digital converters and particularly to converters for converting the output of a condition sensing capacitor arrangement to a digital word. More particularly, this invention relates to a converter of the type described which is isolated from environmental influences for increased stability.

DESCRIPTION OF THE PRIOR ART

Air data computers used for aircraft navigational purposes employ capacitor arrangements whereby capacitance changes as a function of atmospheric pressure and is thus a measure of the altitude of the craft. The capacitors provide analog signals which, for most modern applications, must be converted to digital words. Conversion apparatus has heretofore been used which involves precision bridge circuits providing an AC voltage related to the capacitance change being measured. The AC voltage is then converted to a digital word through the use of precision conversion apparatus such as described in commonly assigned U.S. Pat. No. 3,882,488, issued May 6, 1975, to Henry R. Kosakowski and Douglas J. Washburn. The conversion system described in the aforenoted patent may be used to provide measurements of static and dynamic pressure which are utilized by the air data computer for the aforenoted aircraft navigational purposes.

The bridge circuits involved in the described systems require a large number of precision passive and active components to obtain absolute voltages related to static and dynamic pressure as is required. Further, a considerable amount of filtering is necessary to reduce the errors associated with harmonic distortion and power supply variations. This in turn imparts frequency sensitivity to the output of oscillators used in the system, thus requiring very stable oscillators. It will be recognized by those skilled in the art that the aforenoted factors represent significant disadvantages in a conversion system for the purposes described.

An improved conversion system is described in commonly assigned U.S. Pat. No. 4,001,813, issued on Jan. 4, 1977, to Henry R. Kosakowski. This system features a capacitance to digital conversion system wherein condition sensing capacitors are arranged with reference capacitors in a circuit configuration so as to eliminate the need for an absolute AC voltage thereby imparting a high degree of precision to the system. Primary error sources are virtually eliminated since all operations are performed on an error signal and a single oscillator drives both sensing and reference capacitors so that frequency variations in the output of the oscillator have no effect on the accuracy of the measurement being made. Additionally, the high degree of precision is accomplished with a significant reduction in hardware.

The capacitance to digital conversion system described in U.S. Pat. No. 4,001,813 is less stable than desired, particularly when small capacitance changes are being measured. This is because the capacitors and associated circuitry are unshielded and hence the system is sensitive to environmental conditions resulting in stray capacitances which adversely effect system stability. The configuration of the present invention provides a fixed environment for the circuitry whereby the effect of such stray capacitance is controlled and system stability is increased.

SUMMARY OF THE INVENTION

This invention contemplates a capacitance to digital conversion system including reference and sensing capacitors and dedicated amplifier circuitry disposed within a sealed housing which provides a fixed environment, whereby stray capacitances which might otherwise affect system stability are controlled. An oscillator provides a voltage ($E_R$) for driving the reference capacitors and an N bit digital to analog converter. The digital to analog converter provides a signal ($E_S$) for driving the sensing capacitors. Signal $E_S$ is 180° out of phase with signal ($E_R$) at a magnitude of $(X/2^N) \cdot E_R$ (X=the input to the digital analog converter), and is at a level so that the current through the sensing capacitors equals the negative of the current through the reference capacitors. If the currents through the reference and sensing capacitors are not equal and opposite, an error voltage is developed at the output of the dedicated amplifier circuitry which is used to provide a DC error signal related to a static sensed condition (pressure) $P_S$ or a dynamic sensed condition (pressure) $P_T$, as the case may be. The DC error signal is converted to a digital signal and integrated, the count of which is an indirect measurement of the capacitance of the sensing capacitor, and since the capacitance is directly related to the condition being measured, the digital count is indirectly related to said condition. With the exception of the errors in the digital to analog converter, which are normally an order of magnitude less than the required accuracy of the system, no other primary error sources exist, since all operations are performed on an error signal. Further, since both the sensing and reference capacitors are driven directly by a single oscillator, frequency variations of the oscillator have no effect on the accuracy of the measurement being made. Still further, system stability is increased due to the aforenoted isolation from environmental influences, whereby a fixed environment is provided for the sensing circuitry of the system.

DESCRIPTION OF THE PREFERRED EMBODIMENT OF THE INVENTION

Figure 1:
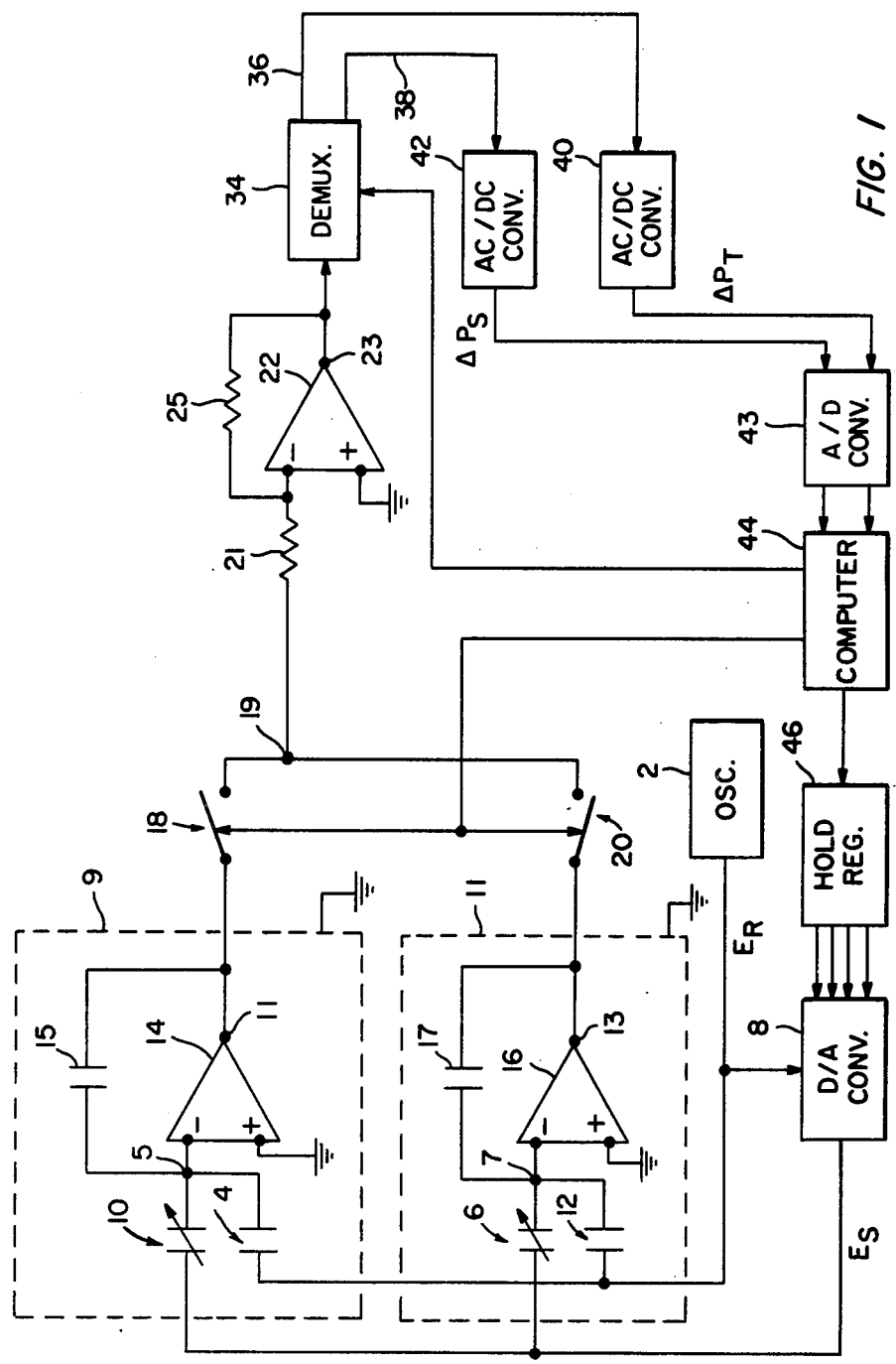
FIG. 1 is a combination block diagram-electrical schematic showing the structural relationship of the components of the invention.

With reference first to FIG. 1, an oscillator designated by the numeral 2, which may be of a conventional non-precision, low source impedance type, provides an alternating signal $E_R$ at a frequency of, for example, three KHz. Signal $E_R$ is applied to a multi-bit digital to analog converter 8, which may be, for purposes of illustration, an eighteen bit converter, and which converter provides a signal $E_S$. Digital to analog converter 8 is arranged so that signal $E_S$ is always 180° out of phase with signal $E_R$ at a magnitude of $(X/2^{18}) \cdot E_R$ (X=the digital to analog converter input). Signal $E_R$ is applied to a reference capacitor 4 and to a reference capacitor 12.

Signal $E_S$ is applied to a sensing capacitor 6 and to a sensing capacitor 10. Signal $E_S$ seeks a voltage level such that the current through sensing capacitor 10 equals the negative of the current through reference capacitor 4, or the current through sensing capacitor 6 equals the negative of the current through reference capacitor 12, as will hereinafter become more evident.

Reference capacitor 4 is connected to sensing capacitor 10 at a circuit point 5. Circuit point 5 is connected to the inverting input terminal (−) of an operational amplifier 14. Reference capacitor 12 is connected to sensing capacitor 6 at a circuit point 7. Circuit point 7 is connected to the inverting input terminal (−) of an operational amplifier 16. Operational amplifiers 14 and 16 have non-inverting input terminals (+) connected to ground.

A capacitor 15 is connected in feedback relation to output terminal 11 of operational amplifier 14 and to circuit point 5, and a capacitor 17 is connected in feedback relation to output terminal 13 of operational amplifier 16 and to circuit point 7. In this connection it will be noted that circuit points 5 and 7 represent virtual ground points as will be understood by those skilled in the art.

Reference capacitor 4, sensing capacitor 10 and amplifier circuitry including amplifier 14, capacitor 15 and virtual ground point 5 are disposed in a sealed housing 9, while reference capacitor 12, sensing capacitor 10 and amplifier circuitry including amplifier 16, capacitor 17 and virtual ground point 7 are disposed in a sealed housing 11. Housings 9 and 11 are connected to ground. In this connection it is noted that housing 9 and amplifier 14 are connected to a common ground and housing 11 and amplifier 16 are connected to a common ground so that the corresponding amplifiers and housings are at the same potential.

Output terminal 11 of amplifier 14 is connected to a normally open switch 18 and output terminal 13 of amplifier 16 is connected to a normally open switch 20. Switches 18 and 20, when closed, as will be hereinafter explained, connect corresponding amplifiers 14 and 16 to a circuit point 19 which, in turn, is connected through a resistor 21 to the inverting input terminal (−) of a gain adjusting amplifier 22. Amplifier 22 has a grounded non-inverting input terminal (+) and has a feedback resistor 25 connected to an output terminal 23 and connected through a resistor 25 to the amplifier inverting input terminal (−).

The device of the invention may utilize the sensed change in capacitance provided by sensing capacitors 6 and 10 for providing measurements of static and dynamic pressure, and for this purpose the capacitors are multiplexed as shown and described.

To achieve the desired conversion from capacitance to static or dynamic pressure, a conventional type demultiplexer 34 is connected to output terminal 23 of amplifier 22 and provides one output at an output line 36 and another output at an output line 38. The output at output line 36 is applied to a conventional type AC to DC converter 40 and the output at output line 38 is applied to a like AC to DC converter 42. AC to DC converters 40 and 42 serve the further purpose of performing a quadrature rejection function. AC to DC converter 40 thus provides an error signal $\Delta P_T$ corresponding to dynamic pressure, and AC to DC converter 42 provides an error signal $\Delta P_S$ corresponding to static pressure.

Error signals $\Delta P_S$ and $\Delta P_T$ are applied through a conventional analog to digital converter 43 to a computer 44 which includes arithmetic units and an integrating unit for operating on the error signals as described in the aforenoted U.S. Pat. No. 3,882,488. The computer output is fed back through a conventional hold register 46 to digital to analog converter 8.

Switches 18 and 20, which may be electronic switches such as transistors or the like, are actuated by computer 44 as is demultiplexer 34, so that a digital count is provided related to dynamic or static pressure, as the case may be. Thus, a digital count related to dynamic pressure is obtained by opening switch 18 and closing switch 20, while a digital count related to static pressure is provided by closing switch 18 and opening switch 20 as will be hereinafter further described with reference to the flow diagram of FIG. 2.

OPERATION OF THE INVENTION

As heretofore noted, digital to analog converter 8 is arranged so that output $E_S$ therefrom is 180° out of phase with reference signal $E_R$ from oscillator 2 at a magnitude of $(X/2^{18}) \cdot E_R$. The object of signal $E_S$ from digital to analog converter 8 is to seek a voltage level such that the current through capacitor 10 equals the negative of the current through capacitor 4, or the current through capacitor 6 equals the negative of the current through capacitor 12, as the case may be.

Figure 2:
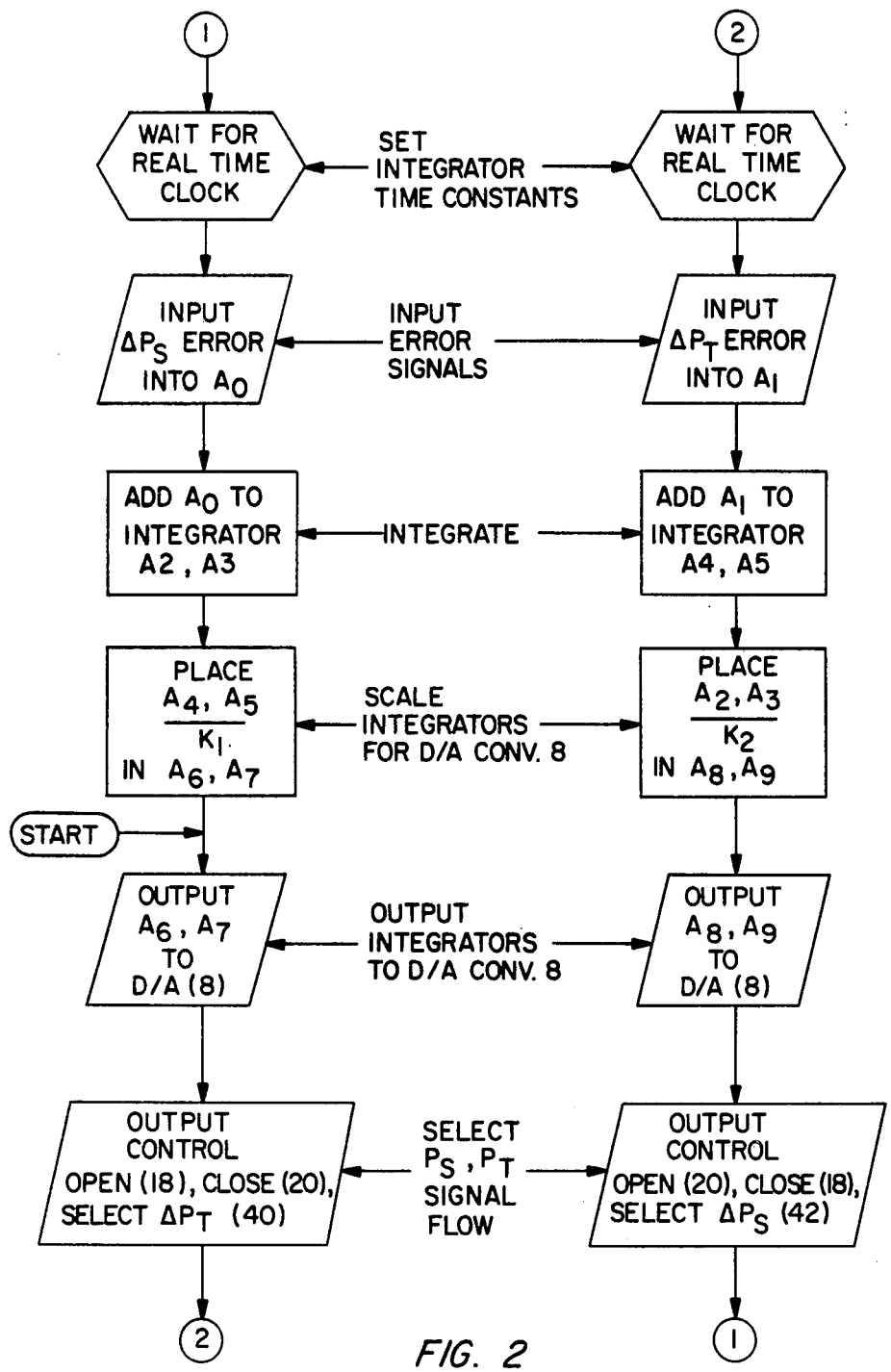
FIG. 2 is a flow chart showing the computer controlled function of the invention.

If it is assumed that switch 18 is closed and switch 20 is opened through the action of computer 44 as illustrated in the flow chart of FIG. 2, and the currents through capacitors 4 and 10 are not equal and opposite, an error voltage is developed at output terminal 11 of amplifier 14. This error voltage is fed back to virtual ground point 5 through feedback capacitor 15. Consequently, an AC error voltage exists at the output terminal of amplifier 14 equal to:

$$-[E_R(C_4/C_{15}) - E_S(C_{10}/C_{15})]. \quad (1)$$

The error voltage is applied through gain adjusting amplifier 22 and demultiplexer 34 to, for example, converter 42 to provide DC error signal $\Delta P_S$ corresponding to the static pressure error.

Error signal $\Delta P_S$ is applied through A/D converter 43 to computer 44 as described in the aforenoted U.S. Pat. No. 3,882,488 and fed back to digital to analog converter 8 through hold register 46. Feedback through computer 44 forces signal $E_S$ to a value such that:

$$-[E_R(C_4/C_{15}) - E_S(C_{10}/C_{15})] = 0. \quad (2)$$

Under this condition the following relationship holds:

$$E_S = E_R(C_4/C_{10}) \quad (3)$$

Since signal $E_S$ equals the digital count from computer 44 multipled by signal $E_R/2^{18}$, the digital count equals $(C_4 \cdot 2^{18})/C_{10}$, and since $C_4$ and $2^{18}$ are constant, the digital count is an indirect measurement of the capacitance of capacitor 10. Further, the capacitance of capacitor 10 is directly related to static pressure and therefore the digital count is indirectly related to static pressure.

It will now be understood that a digital count indirectly related to dynamic pressure, i.e., $P_T$, is obtained in a similar manner by opening switch 18 and closing switch 20 through computer 44 as illustrated in the flow chart of FIG. 2. If digital counts directly related to static and dynamic pressure are desired they can be obtained by eliminating the inversion in digital to analog converter 8 and off-setting the digital to analog converter by $-E_R$, and whereby $E_S$ would then be represented by the following relationship:

$$E_S = -E_R[1-(X/2^{18})] \qquad (4)$$

FIG. 2 is a flow chart illustrating a program for computer 44 in operating digital to analog converter 8, demultiplexer 34 and switches 18 and 20. In this connection it will be recognized that the designations $A_0$ to $A_9$ in the flow chart of FIG. 2 are indicative of accumulators included in the computer as is well known in the computer art.

The programmed sequence is started in accordance with the structural relationship of FIG. 1 when outputs are provided to digital to analog converter 8, whereupon control for switch 18 which is opened and switch 20 which is closed, and control for selecting error signal $\Delta P_T$ through AC/DC converter 40 via demultiplexer 34 is provided.

The sequence continues with an appropriate real time constant built into the program, whereupon error signal $\Delta P_T$ is integrated and scaled, and outputted to digital to analog converter 8. The computer output control function thereupon opens switch 20 while closing switch 18 for selecting through multiplexer 34 error signal $\Delta P_S$ via AC/DC converter 42.

In continuation, an appropriate real time constant is built into the program and signal $\Delta P_S$ is integrated and scaled for application to digital to analog converter 8 whereupon the program sequence is repeated.

It will now be seen from the aforegoing description of the invention that with the exception of any errors that may be inherent in digital to analog converter 8, which are normally an order of magnitude less than the required accuracies of the system described, no other primary error sources exist since all operations are performed on an error signal. Moreover, since both the sensing and reference capacitors are driven directly by a single oscillator, i.e., oscillator 2, frequency variations of the oscillator have no effect on the accuracy of the conversion being made. Further, for the same reason, interim filtering is not necessary and voltage variations and harmonic distortions cancel. Of further significance is the fact that a significant component reduction may be realized by constructing the invention as described as compared to prior art devices now available.

Moreover, the configuration of the invention wherein amplifier circuitry is dedicated to each condition sensing (pressure) cell and the cells are disposed in sealed housings renders the system isolated from environmental influences resulting in stray capacitances which would otherwise affect the stability of the system. In this connection it is noted that the arrangement shown and described provides amplifiers 14 and 16 with a constant gain by using feedback capacitors 15 and 17, respectively, such that the feedback capacitance is proportional to the quotient of the capacitance of capacitors 10 or 6, divided by the capacitance of the feedback capacitors 15 or 17, respectively, i.e., $(C_{10}/C_{15})$ or $(C_6/C_{17})$, as the case may be.

What is claimed is:

1. In a capacitance to digital conversion system wherein a digital representation is provided of the capacitance value of a condition sensing capacitor or the value of the stimulus to which said conditiion sensing capacitor is exposed, said system including said condition sensing capacitor, a reference capacitor, a feedback capacitor, operational amplifier means, means connecting said condition sensing capacitor and said reference capacitor as input impedances to said operational amplifier means, means connecting said feedback capacitor from the output to the input of said operational amplifier means in inverse feedback relationship, the output of said operational amplifier means constituting an error signal, means for converting said error signal to a digital error signal, means for integrating said digital error signal and storing the result of integration, a source of alternating reference signal, means for varying the amplitude of said reference signal in accordance with said integrated error signal to provide a sensing signal, means applying said reference signal to said reference capacitor, and means applying said sensing signal to said sensing capacitor, said reference signal and said sensing signal being applied to the respective capacitors in inverse phase relationship;

the improvement comprising:
an electrically conductive housing enclosing in a single structure said reference capacitor, said sensing capacitor, said feedback capacitor and said operational amplifier means, said operational amplifier means including an amplifier having inverting and non-inverting inputs;
means permanently connecting said reference capacitor, said sensing capacitor and said feedback capacitor to said inverting input of said amplifier; and
means connecting said housing and said non-inverting input of said amplifier to a point of common potential.

2. The improvement of claim 1 wherein said housing is hermetically sealed.

3. In a capacitance to digital conversion system wherein digital representations are provided of the capacitance values of a plurality of condition sensing capacitors or of the values of a plurality of the stimuli to which a plurality of condition sensing capacitors are exposed, said system including a plurality of condition sensing capacitors, a like plurality of reference capacitors, one each of which is associated with an individual one of said condition sensing capacitors, operational amplifier means including a feedback capacitor connected in inverse feedback relationship from the output to the input of said operational amplifier means, means for connecting one each of said condition sensing capacitors and said reference capacitors as input impedances to said operational amplifier means, the output of said operational amplifier means constituting individual error signals associated with the particular condition sensing and reference capacitors connected to the input thereof, means for converting each of said error signals to a digital error signal each of which is associated with a particular condition sensing and reference capacitor, means for integrating said digital error signals and storing the results of integration, a source of alternating reference signal, means for varying the amplitude of said reference signal in accordance with said stored integrated error signals to provide a plurality of sensing signals each of which is associated with a particular condition sensing and reference capacitor, said reference signal and a particular one of said sensing signals being applied to the associated reference and sensing capacitors in inverse phase relationship;
the improvement comprising a plurality of operational amplifiers constituting said operational amplifier means, each amplifier of said plurality including an inverting input and a non-inverting input;

a feedback capacitor for each of said operational amplifiers, said feedback capacitor being permanently connected in each of said operational amplifiers from the output to said inverting input thereof;

one each of said sensing and reference capacitors being permanently connected to said inverting input of each of said amplifiers;

a plurality of electrically conductive housings each of which encloses in a single structure one each of said plurality of operational amplifiers and said feedback, sensing and reference capacitors connected to the input thereof;

means connecting each of said housings and each of said non-inverting inputs of said operational amplifier to a point of common potential; and means connected to the outputs of each of said plurality of operational amplifiers for selecting a particular output to provide one said individual error signal.

4. The improvement of claim 3 wherein each of said plurality of housings is heremetically sealed.